(12) United States Patent  
Orban

(10) Patent No.: US 6,633,173 B1
(45) Date of Patent: Oct. 14, 2003

(54) METHOD AND APPARATUS FOR TESTING FOR LATCH-UP IN INTEGRATED CIRCUITS

(75) Inventor: Richard Orban, Raleigh, NC (US)

(73) Assignee: Renesas Technology America, Inc, San Jose, CA (US)

( * ) Notice: Subject to any disclaimer, the term of this patent is extended or adjusted under 35 U.S.C. 154(b) by 34 days.

(21) Appl. No.: 09/694,342

(22) Filed: Oct. 24, 2000

(51) Int. Cl.[7] ................................................ G01R 31/09
(52) U.S. Cl. ...................................... 324/750; 324/765
(58) Field of Search ................................ 324/750, 751, 324/752, 763; 348/126, 149, 312; 250/358.1

(56) References Cited

U.S. PATENT DOCUMENTS

| | | | |
|---|---|---|---|
| 4,755,874 A | * 7/1988 | Esrig et al. | 348/126 |
| 4,812,748 A | 3/1989 | Brust et al. | |
| 4,902,966 A | 2/1990 | Brust et al. | |
| 4,920,571 A | * 4/1990 | Abe et al. | 358/1.9 |
| 5,030,829 A | 7/1991 | Plies et al. | |
| 5,334,540 A | 8/1994 | Ishii | |
| 5,430,305 A | 7/1995 | Cole, Jr. et al. | |
| 5,493,236 A | 2/1996 | Ishii et al. | |
| 5,541,547 A | * 7/1996 | Lam | 348/126 |
| 5,940,545 A | * 8/1999 | Kash et al. | 382/312 |

FOREIGN PATENT DOCUMENTS

JP            02116139        4/1990

OTHER PUBLICATIONS

Chen, S., et al. "Infrared Imaging and Backside Failure Analysis Techniques on Multilayer CMOS Technology", Physical & Failure Analysis of Integrated Circuits, 1997, Proceedings of the 1997 6th International Symposium on Singapore Jul. 21–25, 1997, New York, NY USA, IEEE US, pp. 17–20.

Haraguchi, K., "Microscopic Optical Beam Induced Current Measurements and their Applications", Instrumentation and Measurement Technology Conference 1994, IMTC/94. Conference Proceedings 10th Anniversary Advanced Technologies in I & M, 1994 IEEE Hamamatsu, Japan, May 10–12, 1994, New York, NY USA, IEEE pp. 693–699.

Silicon Processing For the VLSI Era, vol. II, Chapter 6.4, Stanley Wolf, Ph.D., Lattice Press, 1990 (Unavailable month).

* cited by examiner

Primary Examiner—Vinh P. Nguyen
(74) Attorney, Agent, or Firm—Burns, Doane, Swecker, Swecker & Mathis, L.L.P.

(57) ABSTRACT

A circuit is tested for latch-up by scanning an optical beam across the surface, supplying power to the integrated circuit, monitoring the power of the power supply, and detecting latch-up in the integrated circuit by capturing an image of the integrated circuit when the power reaches a predetermined threshold. The captured image is compared with a baseline image to determine where latch-up occurs in the circuit.

22 Claims, 4 Drawing Sheets

METHOD AND APPARATUS FOR TESTING FOR LATCH-UP IN INTEGRATED CIRCUITS

BACKGROUND

This invention relates generally to a method and apparatus for testing integrated circuits. More specifically, this invention relates to a method and apparatus for testing for latch-up in integrated circuits.

A major problem in integrated circuits is a phenomenon known as latch-up. Latch-up occurs when triggering current causes complementary bipolar structures in the integrated circuit to interact electrically, establishing a low-resistance path, thus allowing large current to flow through the circuit. This can cause the circuit to cease functioning or even to self-destruct due to heat damage caused by high power dissipation.

Latch-up may be caused by, e.g., termainal over voltage stress, transient displacement current, ionizing radiation, impace ionization by hot electrons, or light.

A detailed explanation of latch-up is given in, e.g., Silicon Processing for the VLSI ERA, Vol. II, Chapter 6.4, Stanley Wolf, Ph.D., Lattice Press, 1990.

Various techniques have been developed for detecting latch-up in integrated circuits.

One known technique for detecting latch-up is Optical Beam Induced Current (OBIC) methodology. A device for performing this technique is shown in FIG. 1A. The device includes, among other features, a scanning unit (SU) 110, an amplifier 130, and a signal processing unit (SPU) 140. A rastorized optical beam, e.g., a laser produced by the SU 110 is scanned across a specimen, such as an integrated circuit (IC) 120. A laser scanning microscope (LSM) may be used as the SU 110 to produce the laser. When the optical beam impacts the IC surface, electron-hole pairs are generated, in effect inducing a current. Information regarding the position of the optical beam is fed to the SPU 140. While the laser scans, the Vcc or Vss current induced by the optical beam is amplified by the amplifier 130 and recorded and synchronized with the position of the optical beam in the SPU 140. Information regarding the measured current and the positioning of the optical beam is converted into an image by the SPU 140, with the highest current being represented as the highest intensity. Low current effectively becomes transparent. The representative image of current is overlaid with an optical image generated by the LSM. The resulting image indicates where high current exists in the IC, which indicates where latch-up has occurred in the IC.

FIG. 1B depicts a graph indicating where latch-up occurs using the OBIC method. In FIG. 1B, the x-axis represents a position in one direction, e.g., a horizontal direction, on the surface of the IC, and the y-axis represents the current. As can be seen from FIG. 1B, a high current exists at a position $x_1$, indicating latch-up. Several of these graphs may be produced along several such lines, across the surface of the IC. The results may be combined to produce a two dimensional image, indicating where latch-up occurs in the IC.

An example of OBIC technology is given in U.S. Pat. No. 4,812,748. As described in this patent, the LSM is fixed on a point, and the test program is run. The current is monitored, and if the current does not exceed a threshold current setting, the LSM moves to a new focal spot and starts over. If the threshold current is exceeded, the method is repeated using a reduced intensity laser over the localized region.

OBIC technology is also described in U.S. Pat. Nos. 4,902,966, 5,334,540 5,430,305, and 5,493,236.

Another technique for detecting latch-up is a modulated laser. A device for performing this technique is shown in FIG. 2A. According to this method, a laser beam is scanned across the surface of an IC, the IC is powered by a power supply (PS) 160, and an SPU 145 varies the power of the modulated laser 105 to maintain a constant current. The power is lowered if the current rises. The SPU 145 processes this information to produce an image. When the current drops, this indicates latch-up.

FIG. 2B depicts a graph indicating where latch-up occurs using a modulated laser. In FIG. 2B, the x-axis represents a position on the IC, and the y-axis represents power. As can be seen from FIG. 2B, at a position $x_2$ on the IC, the power drops, indicating latch-up. In a manner similar to that explained above with regard to FIG. 1B, several of these graphs can be produced along lines across the IC, and the results can be combined to produce a two-dimensional image, indicating where latch-up occurs in the IC.

Conventional methods of latch-up testing and analysis of integrated circuits are time consuming, taking days or even weeks to set up and complete, due to the sensitivity of the equipment used. Also, standard testing methods are not capable of testing most internal nodes or under many different operational conditions, because of the preciseness required to obtain results.

There is thus a need for a technique for testing integrated circuits that may be performed quickly and under many different operational conditions.

SUMMARY

It is therefore an object of the present invention to provide a technique for quickly detecting latch-up in an integrated circuit. It is yet another object of the present invention to provide a technique capable of detecting latch-up in an integrated circuit under many different operational conditions.

According to an exemplary embodiment, this and other objects are met by a method and apparatus for detecting latch-up in a circuit, e.g., an integrated circuit. According to exemplary embodiments, an optical beam is scanned across the surface of the integrated circuit, power is supplied to the integrated circuit, and the power of the power supply is monitored. When the power reaches a predetermined threshold, an image of the integrated circuit is captured. The captured image is compared with an image taken with the laser off to determine where latch-up occurs on the integrated circuit.

BRIEF DESCRIPTION OF THE DRAWINGS

The features, objects, and advantages of the invention will become apparent by reading this description in conjunction with the accompanying drawings, in which like reference numerals refer to like elements and in which.

DETAILED DESCRIPTION

According to an exemplary embodiment, a device and a method are provided for quickly testing a component, such as an IC, for latch-up.

It is known that light triggers latch-up. This is taken advantage of in the present invention for testing for latch-up, using light to find the area in the IC where latch-up occurs.

Figure 1A:
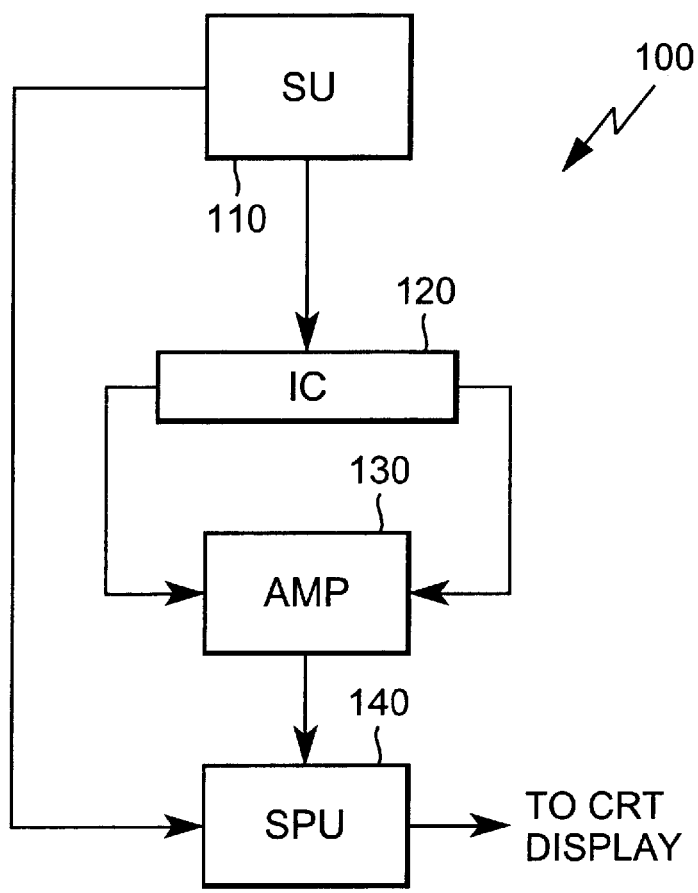
FIG. 1A illustrates a conventional OBIC device for testing integrated circuits.
Figure 1B:
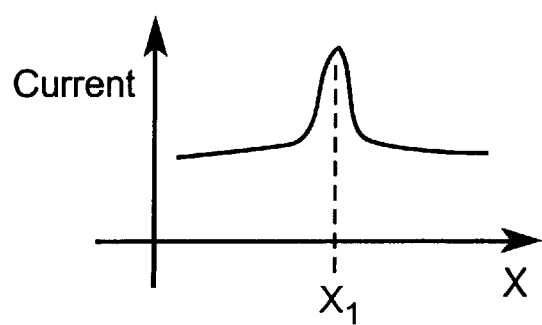
FIG. 1B depicts a graph indicating where latch-up occurs.
Figure 2A:
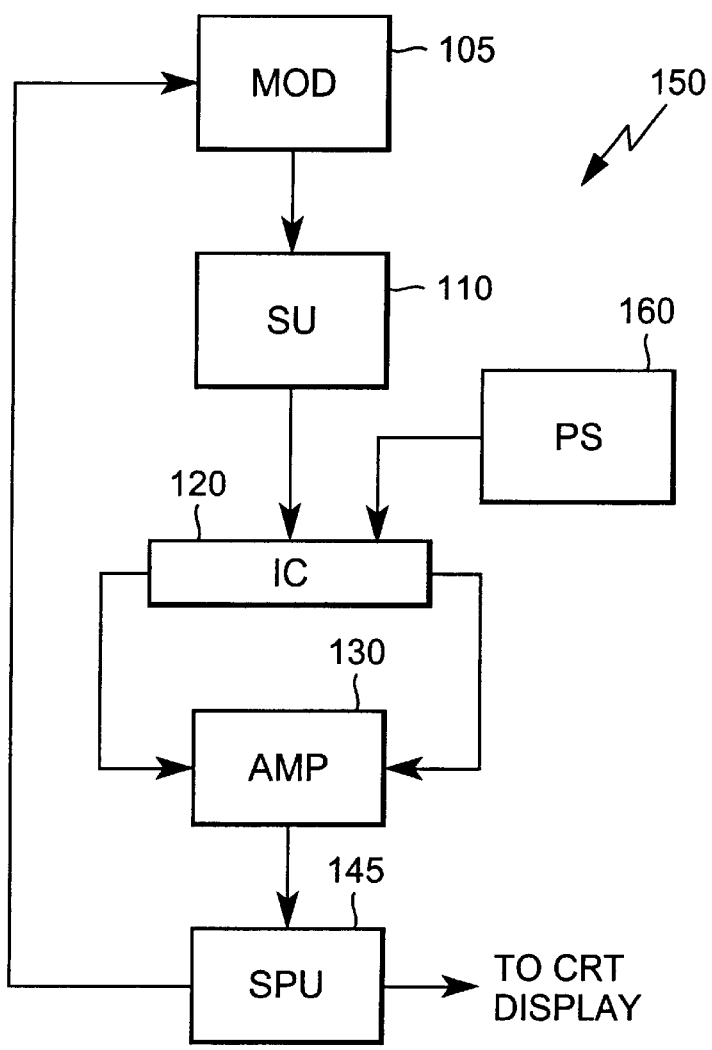
FIG. 2A illustrates a conventional modulated laser device for testing integrated circuits.
Figure 2B:
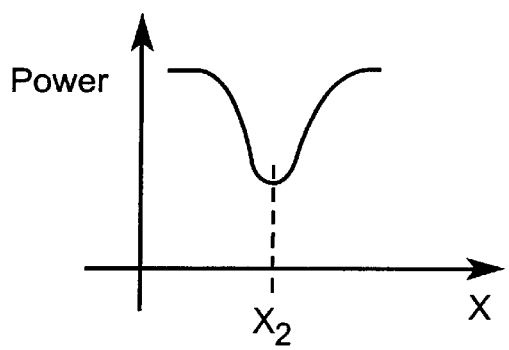
FIG. 2B depicts a graph indicating where latch-up occurs.
Figure 3:
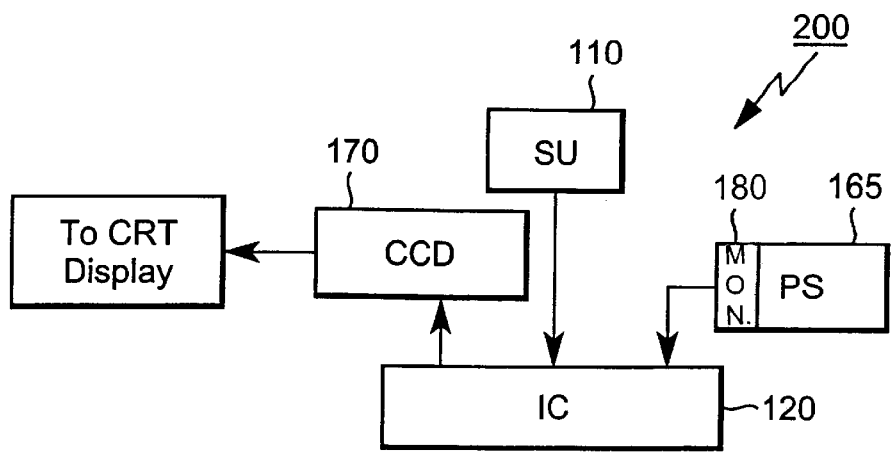
FIG. 3 illustrates an apparatus for testing an integrated circuit according to an exemplary embodiment.

An exemplary device for testing for latch-up in an IC is shown in FIG. 3. In FIG. 3, a rastorized optical beam from an SU 110 is used to scan a specimen, such as an IC 120, under either DC or AC conditions. The optical beam may be scanned through either the topside of the IC 120 (metallization) or the backside (silicon), inducing current (via electron-hole pairs) at individual transistors in the IC 120. The localized transient current triggers latch-up in an improperly designed structure. The latch-up causes the power to spike. A current-limiting power supply 165 may be used to limit the current delivered to the latched-up site on the IC 120 to prevent the device from being destroyed. A monitor 180 can be used to monitor the power delivered by the power supply 165 to the IC 120. The monitor 180 can be combined with the power supply 165, as shown in FIG. 3, or can be a separate unit. The design and use of such monitors are commonly known to those skilled in the art, and consequently will not be discussed in detail here. Thus, by monitoring the output of the current-limiting power supply 165 via the monitor 180, the occurrence of latch-up can be detected by a sharp rise in the power, up to or above a predetermined threshold.

If the IC is latched-up, the location of the site can be viewed by using a highly sensitive camera, e.g., a CCD 170, to capture photons that are emitted from the electron-hole recombination. Any commercially available CCD having a relatively high sensitivity to photons near the silicon bandgap energy may be used.

The image captured by the CCD 170 may be analyzed to determine where latch-up occurs in the IC. Analysis may be performed by, e.g., comparing the captured latch-up image with an image of the IC with the power supplied, but with the laser off. For this purpose, an image of the IC with the power supplied and the laser off may be captured in advance by the CCD 170. This comparison is made to rule out imperfections in the IC that might be mistaken for latch-up. Analysis may be performed manually or by a microprocessor.

OBIC technology is performed on IC's that are in a DC mode. According to exemplary embodiments, testing may be performed on IC's that are being externally driven by an automated tester or that are supplied power by an internal oscillator, in an AC mode or a DC mode.

According to exemplary embodiments, testing may be completed relatively quickly, e.g., in 10 to 20 minutes on an entire IC in either DC or AC modes. The test identifies physical locations of defects in the IC, allowing rapid design modifications if necessary.

Figure 4:
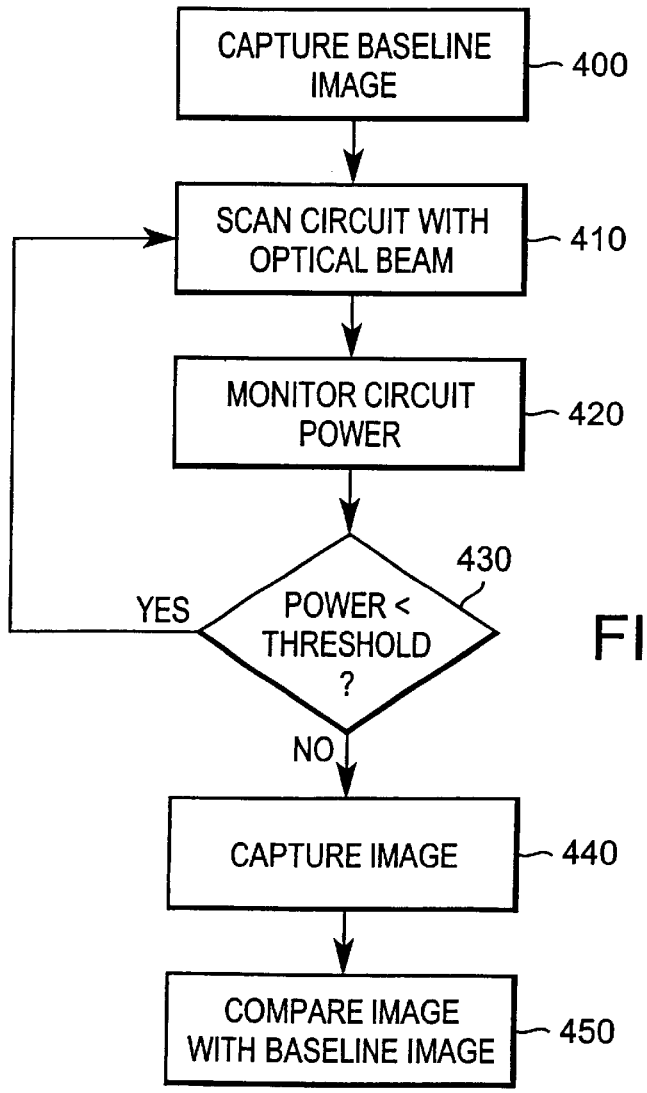
FIG. 4 illustrates a method for testing an integrated circuit according to an exemplary embodiment.

An exemplary method for detecting latch-up is shown in FIG. 4. The method begins at step 400 by first capturing a baseline image of the IC. In an exemplary embodiment, this is accomplished by illuminating the IC with a low-level light source and recording an image that is reflected from the IC. The intensity level of the light source is such that any current induced by the light source is normally insufficient to cause a latch-up condition in the IC. Because the low-level light intensity is normally insufficient to cause latch-up in the device, the baseline image can be captured with the IC power on. This provides a more accurate measure of the photon emissions produced by an IC operating under normal conditions as compared to baseline images that are captured with the IC power off.

In an another exemplary embodiment, the baseline image is captured by laser scanning the IC and recording an image reflected from the IC. This method should be performed with the IC power off, as the laser light may be of sufficient intensity to trigger a latch-up condition in the IC.

Once a baseline image has been captured, the scanning laser is turned on and the IC is scanned at step 410. The power supply is on while the IC is being scanned. During the scan of the IC, the power supply is monitored at step 420 to detect changes in the amount of power delivered to the IC. The amount of power delivered to the IC is compared to a predetermined threshold level at step 430 in order to determine whether a latch-up condition may exist in the IC. If the delivered power level exceeds the predetermined threshold, it is likely that a latch-up condition exists in the area currently being scanned by the laser.

Figure 5:
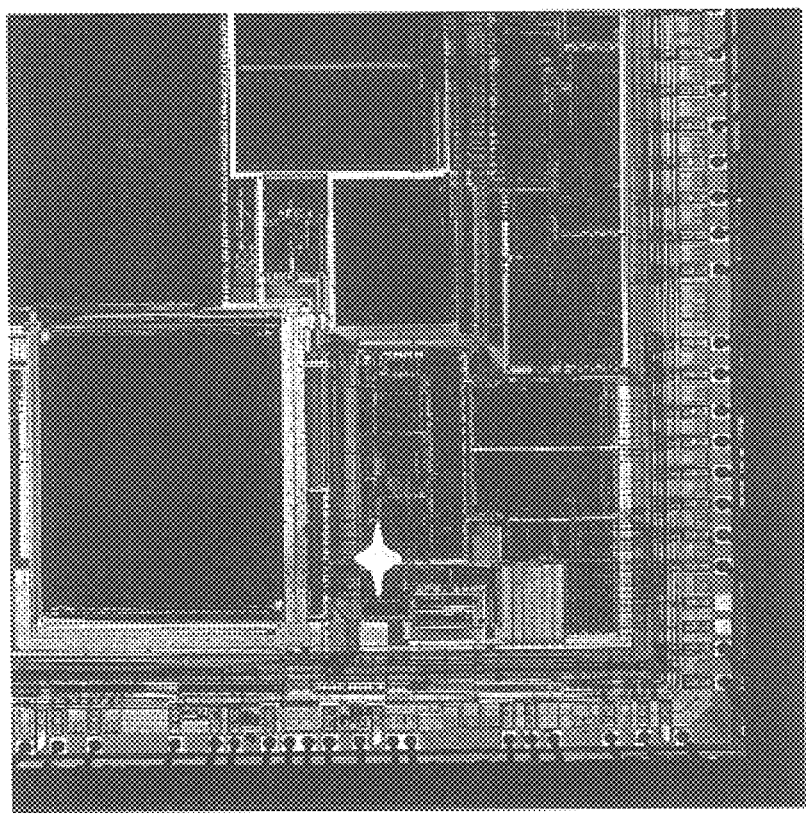
FIG. 5 illustrates results of a test.

The process defined by steps 410 through 430 continues until one of an exceeding of the power threshold and a completion of the IC scan occurs. When the amount of power delivered to the IC exceeds the predetermined threshold, a second image of the IC is captured at step 440. An example of such an image is shown in FIG. 5. This image is then compared at step 450 with the captured baseline image to determine the physical location in the IC where the latch-up condition may exist.

Once a latch-up test is performed, another test, e.g., a JEDEC standard test may be performed to ensure the chip is latch-up immune.

Although described with reference to an IC scanned by a laser, it will be appreciated by those of ordinary skill in the art that this invention can be embodied in other specific forms without departing from its essential character. For example, The embodiments described above should therefore be considered in all respects to be illustrative and not restrictive.

What is claimed is:

1. An apparatus for testing a circuit, comprising:
   a scanner for scanning an optical beam across the circuit;
   a power supply for supplying power to the circuit;
   a monitor for monitoring the power of the power supply during the scanning; and
   a detector for detecting latch-up in the circuit, wherein when the monitor determines that the power reaches a predetermined threshold, the detector captures an image of the circuit that indicates where latch-up occurs in the circuit.

2. The apparatus of claim 1, wherein the circuit is an integrated circuit.

3. The apparatus of claim 1, wherein the detector compares the captured image with a baseline image captured by irradiating the circuit with a low-level light source with the power supply on and recording a reflected image to determine where latch-up occurs.

4. The apparatus of claim 1, wherein the detector compares the captured image with a baseline image captured by scanning an optical beam across the circuit with the power supply off and recording a reflected image to determine where latch-up occurs.

5. The apparatus of claim 1, wherein the power supply is a current-limiting power supply.

6. The apparatus of claim 1, wherein the testing is performed in an AC mode.

7. The apparatus of claim 1, wherein the testing is performed in a DC mode.

8. The apparatus of claim 1, wherein the optical beam is a laser.

9. The apparatus of claim 1, wherein the optical beam is incident on the back side of the circuit.

10. The apparatus of claim 1, wherein the optical beam is incident on the front side of the circuit.

11. The apparatus of claim 1, wherein the detector comprises a charge coupled device.

12. A method of testing a circuit, comprising the steps of:
   capturing a baseline image of the circuit;
   scanning an optical beam across the surface of the circuit;
   monitoring the power delivered from a power supply to the circuit during the scanning;
   capturing a second image of the circuit when the power reaches a predetermined threshold; and
   comparing the baseline image to the second image to determine where latch-up occurs in the circuit.

13. The method of claim 12, wherein the circuit is an integrated circuit.

14. The method of claim 12, wherein the step of capturing a baseline image comprises the steps of:
   irradiating the circuit with a low-level light with the power supply on; and
   recording a reflected image corresponding to the baseline image.

15. The method of claim 12, wherein the step of capturing a baseline image comprises the steps of:
   scanning the optical beam across the surface of the circuit with the power supply off; and
   recording a reflected image corresponding to the baseline image.

16. The method of claim 12, wherein the power supply is a current-limiting power supply.

17. The method of claim 12, wherein the testing is performed in an AC mode.

18. The method of claim 12, wherein the testing is performed in a DC mode.

19. The method of claim 12, wherein the optical beam is a laser.

20. The method of claim 12, wherein the optical beam is incident on the back side of the circuit.

21. The method of claim 12, wherein the optical beam is incident on the front side of the circuit.

22. The method of claim 12, wherein the images are captured using a charge coupled device.

\* \* \* \* \*